US011683053B2

(12) United States Patent
Suzuki et al.

(10) Patent No.: US 11,683,053 B2
(45) Date of Patent: *Jun. 20, 2023

(54) MEMORY CONTROLLER, MEMORY SYSTEM, AND MEMORY CONTROL METHOD

(71) Applicant: KIOXIA CORPORATION, Tokyo (JP)

(72) Inventors: Riki Suzuki, Yokohama (JP); Toshikatsu Hida, Yokohama (JP); Osamu Torii, Setagaya (JP); Hiroshi Yao, Yokohama (JP); Kiyotaka Iwasaki, Kawasaki (JP)

(73) Assignee: KIOXIA CORPORATION, Tokyo (JP)

( * ) Notice: Subject to any disclaimer, the term of this patent is extended or adjusted under 35 U.S.C. 154(b) by 178 days.

This patent is subject to a terminal disclaimer.

(21) Appl. No.: 17/178,604

(22) Filed: Feb. 18, 2021

(65) Prior Publication Data

US 2021/0175907 A1 Jun. 10, 2021

Related U.S. Application Data

(63) Continuation of application No. 16/419,717, filed on May 22, 2019, now Pat. No. 10,965,324, which is a
(Continued)

(51) Int. Cl.
*H03M 13/00* (2006.01)
*H03M 13/35* (2006.01)
(Continued)

(52) U.S. Cl.
CPC ........... *H03M 13/35* (2013.01); *G06F 3/064* (2013.01); *G06F 3/0619* (2013.01);
(Continued)

(58) Field of Classification Search
CPC ............ G06F 11/1076; G06F 11/1068; G06F 11/1048; G06F 11/1044; G06F 11/1008;
(Continued)

(56) References Cited

U.S. PATENT DOCUMENTS 6,055,646 A 4/2000 Uchihori
6,591,339 B1 7/2003 Horst
(Continued)

FOREIGN PATENT DOCUMENTS

JP 2007-207376 8/2007
JP 2009-211209 9/2009
(Continued)

OTHER PUBLICATIONS

Alcorn, Paul, "LSI SandForce SF3700 SSD Flash Controller Announcement Overview," Nov. 18, 2013, 4 Pages, http://www.tweaktown.com/articles/5901/lsi-sandforce-sf3700-ssd-flash-controller-announcement-overview/index3.html.

*Primary Examiner* — Albert Decady
*Assistant Examiner* — Osman M Alshack
(74) *Attorney, Agent, or Firm* — Oblon, McClelland, Maier & Neustadt, L.L.P.

(57) ABSTRACT

According to one embodiment, a nonvolatile memory includes a plurality of memory areas and controller circuit including an error correction code encoder. The error correction code encoder encodes a first data to generate a first parity in a first operation and encodes a second data to generate a second parity in a second operation. The controller circuit writes the first data and the first parity into a first memory area among the plurality of memory areas and writes the second data and the second parity into a second memory area among the plurality of memory areas. The size of the second data is smaller than the size of the first data and the size of the second parity is equal to the size of the first parity.

20 Claims, 11 Drawing Sheets

Related U.S. Application Data continuation of application No. 15/341,580, filed on Nov. 2, 2016, now Pat. No. 10,432,231, which is a continuation of application No. 14/446,463, filed on Jul. 30, 2014, now Pat. No. 9,520,901.

(60) Provisional application No. 61/948,788, filed on Mar. 6, 2014.

(51) Int. Cl.

| | | |
|---|---|---|
| *G06F 11/10* | (2006.01) | |
| *H03M 13/29* | (2006.01) | |
| *G06F 3/06* | (2006.01) | |
| *G11C 29/52* | (2006.01) | |
| *G11C 7/10* | (2006.01) | |
| *G11B 20/18* | (2006.01) | |
| *G11C 29/04* | (2006.01) | |

(52) U.S. Cl.
CPC .......... *G06F 3/0653* (2013.01); *G06F 3/0679* (2013.01); *G06F 11/1008* (2013.01); *G06F 11/1044* (2013.01); *G06F 11/1048* (2013.01); *G06F 11/1068* (2013.01); *G06F 11/1076* (2013.01); *G11C 29/52* (2013.01); *H03M 13/29* (2013.01); *H03M 13/2906* (2013.01); *H03M 13/2957* (2013.01); *G11B 20/1833* (2013.01); *G11C 7/1006* (2013.01); *G11C 2029/0411* (2013.01)

(58) Field of Classification Search
CPC ..... G06F 3/0679; H03M 13/35; H03M 13/29; H03M 13/2906; G11B 20/1833
USPC ................. 714/752, 758, 763, 760
See application file for complete search history.

(56) References Cited

U.S. PATENT DOCUMENTS

| | | | |
|---|---|---|---|
| 8,122,323 B2 | 2/2012 | Leung et al. | |
| 8,381,066 B2 | 2/2013 | Yamaga | |
| 9,071,281 B2 | 6/2015 | Casado | |
| 9,208,018 B1 | 12/2015 | Northcott | |
| 9,430,326 B2 | 8/2016 | Barndt | |
| 2008/0250220 A1* | 10/2008 | Ito ...................... | G06F 12/0246 711/E12.001 |
| 2009/0089644 A1* | 4/2009 | Mead .................... | H03M 13/09 714/758 |
| 2009/0150747 A1* | 6/2009 | Erez .................... | G06F 11/1068 714/755 |
| 2010/0064200 A1* | 3/2010 | Choi ................... | G06F 11/1068 714/773 |
| 2011/0066923 A1 | 3/2011 | Koshiyama | |
| 2011/0197034 A1* | 8/2011 | Nakanishi ........... | G06F 12/0246 711/E12.001 |
| 2011/0264845 A1* | 10/2011 | Choi ................... | G11C 16/0483 711/E12.008 |
| 2012/0072798 A1 | 3/2012 | Unesaki et al. | |
| 2012/0084622 A1* | 4/2012 | D'Abreu ............ | G06F 11/1048 714/755 |
| 2012/0151301 A1* | 6/2012 | Izumi ................ | H03M 13/2909 714/763 |
| 2012/0166906 A1* | 6/2012 | Nagadomi ........ | H03M 13/2906 714/755 |
| 2012/0311397 A1* | 12/2012 | Kim ..................... | H04W 28/06 714/752 |
| 2012/0317341 A1 | 12/2012 | So | |
| 2012/0317463 A1 | 12/2012 | Sugahara et al. | |
| 2013/0117630 A1* | 5/2013 | Kang .................. | G06F 11/1048 714/763 |
| 2013/0138870 A1* | 5/2013 | Yoon .................. | G06F 11/1072 711/E12.008 |
| 2013/0246887 A1* | 9/2013 | Torii ...................... | H03M 13/09 714/758 |
| 2014/0129902 A1* | 5/2014 | Yoon .................. | G11C 16/3422 714/764 |
| 2014/0129903 A1* | 5/2014 | Yoon .................. | G11C 16/0483 714/764 |
| 2014/0223256 A1* | 8/2014 | Sakai .................. | G06F 11/1012 714/758 |
| 2015/0113305 A1* | 4/2015 | Shin ...................... | G06F 3/0679 713/323 |
| 2015/0135039 A1 | 5/2015 | Mekhanik | |
| 2016/0246537 A1* | 8/2016 | Kim ...................... | G06F 3/0659 |

FOREIGN PATENT DOCUMENTS

| | | |
|---|---|---|
| JP | 2010-518523 | 5/2010 |
| JP | 2012-84127 | 4/2012 |
| JP | 2012-137994 | 7/2012 |
| JP | 2012-155737 | 8/2012 |
| JP | 2013-3656 | 1/2013 |

\* cited by examiner

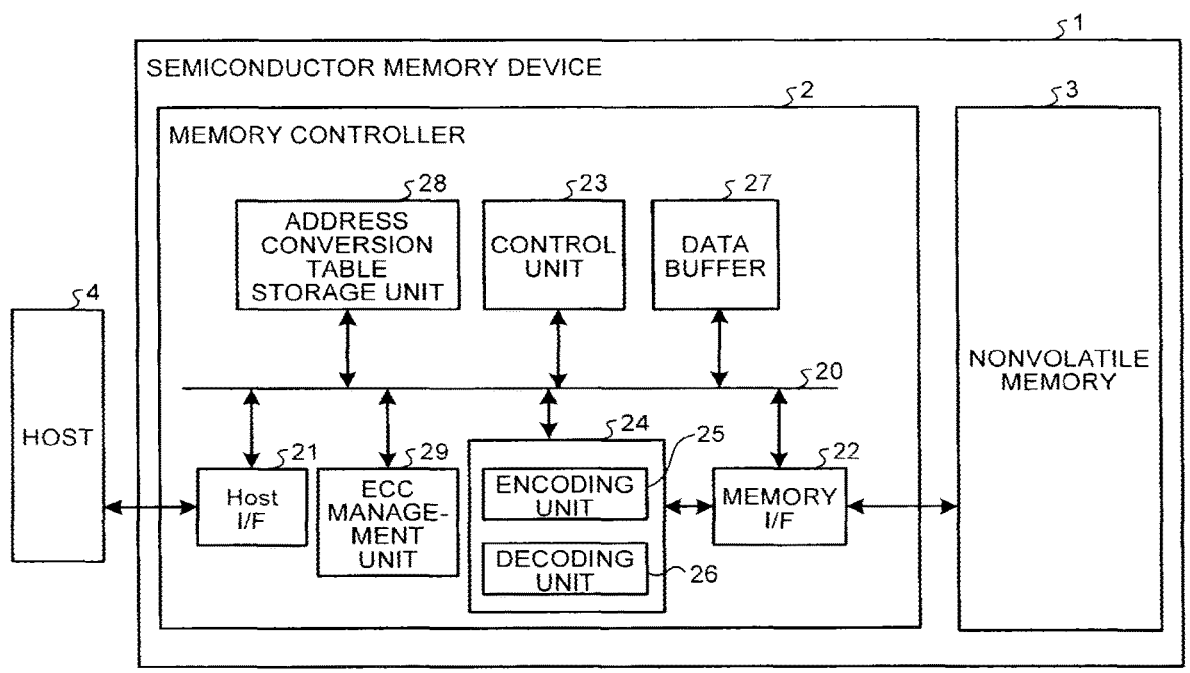

FIG.11

3 PIECES OF DATA

| LOGICAL ADDRESS | PHYSICAL ADDRESS |
|---|---|
| 0000 | 0, X |
| 0004 | 0, Y |
| 0008 | 0, Z |
| 0012 | 1, X |
| ⋮ | ⋮ |

4 PIECES OF DATA

| LOGICAL ADDRESS | PHYSICAL ADDRESS |
|---|---|
| 0000 | 0, A |
| 0004 | 0, B |
| 0008 | 0, C |
| 0012 | 0, D |
| ⋮ | ⋮ |

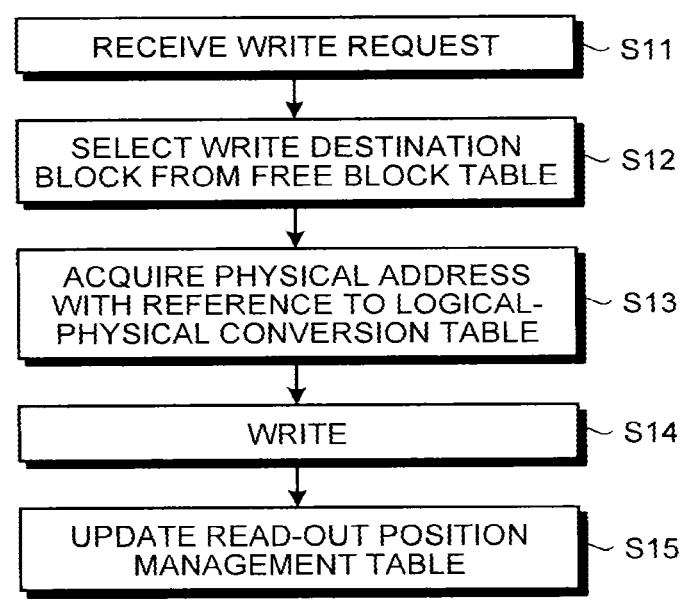

FIG.14

| LOGICAL ADDRESS | LOGICAL BLOCK ADDRESS |
|---|---|
| 0000_0000 | 0000 |
| 0000_0004 | 0000 |
| 0000_0008 | 0000 |
| 0000_000C | invalid |
| ⋮ | ⋮ |

FIG.15

| LOGICAL BLOCK ADDRESS | PHYSICAL ADDRESS |
|---|---|
| 0000 | 1987_6557, 89F3_C847 |
| 0004 | 5212_4678, BC54_6576 |
| 0008 | 4253_3467, 4563_47CC |
| 000C | 8435_6545, A43D_75B3 |
| ⋮ | ⋮ |

MEMORY CONTROLLER, MEMORY SYSTEM, AND MEMORY CONTROL METHOD

CROSS-REFERENCE TO RELATED APPLICATIONS

This application is a continuation of U.S. patent application Ser. No. 16/419,717, filed on May 22, 2019, now U.S. Pat. No. 10,965,324, which is a continuation of U.S. patent application Ser. No. 15/341,580, filed on Nov. 2, 2016, and which is now U.S. Pat. No. 10,432,231 which is a continuation of U.S. patent application Ser. No. 14/446,463, filed on Jul. 30, 2014, and which is now U.S. Pat. No. 9,520,901 U.S. patent application Ser. No. 14/446,463 is based upon and claims the benefit of priority from U.S. Provisional Application No. 61/948,788, filed on Mar. 6, 2014. The entire contents of each of these applications are incorporated herein by reference.

FIELD

Embodiments described herein relate to a memory controller, a memory system, and a memory control method.

BACKGROUND

When user data stored in a memory is read out of the memory, the read-out user data may be different from the original value thereof. In order to handle such a problem, there is a typical method of encoding the user data for error correction, generating redundant data called parity, and storing a set of the user data and the parity in the memory. At the time of the occurrence of errors, the correction is performed using the parity data.

As the error correcting code, there are a BCH code, an RS (Reed Solomon) code and the like, for example. In recent years, a probability of errors occurring increases as the memory becomes miniaturized and multivalued, and thus a stronger error correcting code is requested. In order to improve an error correction capability, it is a general method to increase the data size of the parity. However, there are problems in such a method such as an increase in circuit scale necessary for the error correcting code, and a decrease in capacity of the user data to be stored (or, an increase in memory size).

BRIEF DESCRIPTION OF THE DRAWINGS

FIG. 1 is a block diagram illustrating an exemplary configuration of a memory device according to a first embodiment;

FIG. 2 is a diagram illustrating an example of improving an error correction capability by increasing the data size of parity;

FIG. 11 is a diagram illustrating an example of an address conversion table according to the second embodiment;

FIG. 12 is a flowchart illustrating an example of a writing procedure according to the second embodiment;

FIG. 13 is a diagram illustrating an example of a free block table;

FIG. 14 is a diagram illustrating an example of a read-out position management table;

FIG. 15 is a diagram illustrating an example of a logical-physical conversion table.

DETAILED DESCRIPTION

Figure 3:
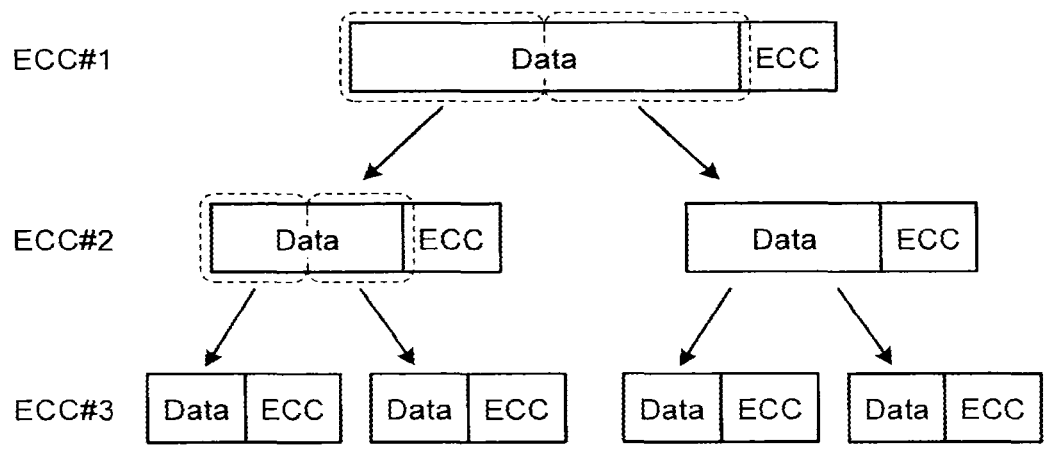
FIG. 3 is a diagram illustrating an example of improving the error correction capability by dividing user data.

In general, according to one embodiment, there is provided a memory controller including a writing destination management unit configured to determine a writing destination of user data, an encoding unit configured to encode the user data to generate a parity, an ECC management unit configured to measure a fatigue degree of each certain memory area of a nonvolatile memory, to select an encoding among a plurality of encoding methods to be performed on the user data which is stored in a certain memory area, and to instruct the encoding unit to encode the user data according to the encoding method corresponding to the certain memory area which corresponds to the writing destination of the user data, and a writing control unit configured to make a control on the nonvolatile memory to write the user data at the writing destination determined by the writing destination management unit. The ECC management unit is configured to be provided with a memory controller to change the encoding method to an encoding method having a high error correction capability in a case where the fatigue degree of the certain memory area corresponding to the writing destination of the user data is equal to or higher than a threshold and a total sum of parities of the nonvolatile memory is equal to or less than a predetermined amount.

Exemplary embodiments of a memory controller, a memory system, and a memory control method will be explained below in detail with reference to the accompanying drawings. The present invention is not limited to the following embodiments.

First Embodiment

FIG. 1 is a block diagram illustrating an exemplary configuration of a memory device (a semiconductor memory device) according to a first embodiment. A semiconductor memory device 1 according to the embodiment includes a memory controller 2 and a nonvolatile memory 3. The semiconductor memory device 1 is configured to be connected to a host 4, which is illustrated in a state of being connected to the host 4 in FIG. 1. The host 4, for example, is an electronic apparatus such as a personal computer and a mobile terminal.

The nonvolatile memory 3 is a nonvolatile memory which stores data in a nonvolatile manner, for example, a NAND memory. Further, herein, the description will be made about an example using the NAND memory as the nonvolatile memory 3, but other memories except the NAND memory may be used. In the NAND memory, data is generally written or read out in data units of writing called pages.

The memory controller 2 controls writing to the nonvolatile memory 3 according to a write command from the host 4. In addition, the memory controller 2 controls reading out of the nonvolatile memory 3 according to a read-out command from the host 4. The memory controller 2 includes a host I/F 21, a memory I/F 22 (a memory control unit), a control unit 23, an ECC (Error Correcting Code) unit 24, a data buffer 27, an address conversion table storage unit 28, and an ECC management unit 29, all of which are connected to one another through an internal bus 20.

The host I/F 21 outputs a command received from the host 4, user data (write data), and the like to the internal bus 20. In addition, the host I/F 21 transmits the user data read out of the nonvolatile memory 3, a response from the control unit 23, and the like to the host 4.

The memory I/F 22 controls a process of writing the user data and the like to the nonvolatile memory 3 and a process of reading the data out of the nonvolatile memory 3 based on an instruction of the control unit 23.

The control unit 23 integrally controls the semiconductor memory device 1. The control unit 23, for example, is a CPU (Central Processing Unit), an MPU (Micro Processing Unit), or the like. When receiving a command from the host 4 through the host I/F 21, the control unit 23 makes a control according to the command. For example, the control unit 23 instructs the memory I/F 22 to write the user data and parity to the nonvolatile memory 3 according to the command from the host 4. In addition, the control unit 23 instructs the memory I/F 22 to read the user data and the parity out of the nonvolatile memory 3 according to the command from the host 4.

When receiving a write request from the host 4, the control unit 23 determines a storage area (a memory area) on the nonvolatile memory 3 for the user data to be accumulated in the data buffer 27. In other words, the control unit 23 has a function as a writing destination management unit which determines a writing destination of the user data. A correspondence relation between the logical address of the user data received from the host and the physical address indicating the storage area on the nonvolatile memory 3 stored with the user data is stored as an address conversion table in the address conversion table storage unit 28. The address conversion table may be configured to directly indicate the correspondence relation between the logical address and the physical address, or may be configured as a multistage table. The multistage table means a plurality of tables which are used for converting the logical address into an intermediate address once and then converting the intermediate address into the physical address.

When receiving a read-out request including the logical address from the host 4, the control unit 23 specifies the physical address corresponding to the logical address, and indicates the physical address to instruct the memory I/F 22 to read out the user data.

The ECC unit 24 includes an encoding unit 25 and a decoding unit 26. The encoding unit 25 encodes the user data stored in the data buffer 27 to generate the parity. The decoding unit 26 decodes the user data and the parity read out of the nonvolatile memory 3. The encoding of the embodiment will be described below in detail.

The data buffer 27 temporarily stores the user data received from the host 4 until the user data is stored in the nonvolatile memory 3, or temporarily stores the data read out of the nonvolatile memory 3 until the data is transmitted to the host 4. For example, the data buffer is configured by a general-purpose memory such as an SRAM (Static Random Access Memory) or a DRAM (Dynamic Random Access Memory). The address conversion table storage unit 28 stores the address conversion table.

The ECC management unit 29 selects an error correction capability based on a fatigue degree of the nonvolatile memory 3, and gives an instruction to the ECC unit 24. The operation of the ECC management unit 29 will be described below.

In this specification, memory cells commonly connected to a word line included in the nonvolatile memory 3 is defined as a memory cell group. In a case where the memory cell is a multi-level cell, the memory cell group corresponds to a plurality of pages. For example, in a case where a multi-level cell capable of storing two bits is used, the memory cell group corresponds to two pages. In this specification, writing to one page of the nonvolatile memory 3 means writing to one memory cell group in the case of a single-level cell, and writing to one page among the plurality of pages corresponding to one memory cell group in the case of the multi-level cell.

The nonvolatile memory 3 is configured by one or more memory chips. The memory chip is configured by a plurality of blocks (physical blocks). The block is configured by a plurality of memory cell groups.

Next, the error correction capability of the embodiment will be described. In this specification, the error correction capability is assumed to indicate correctable errors (the number of correctable bits) with respect to a certain amount of data. In the embodiment, the error correction capability is changed according to the fatigue degree of the nonvolatile memory 3. As a method of improving the error correction capability, the following two methods can be exemplified. The first one is a method of fixing the data size of the user data included in a code word and increasing the data size of the parity. FIG. 2 is a diagram illustrating an example of improving an error correction capability by increasing the data size of the parity. In the drawing, "Data" denotes the user data Portion, and "ECC" denotes the parity portion. Further, the parity may be a parity for error correction, or may be configured by both the parity for error detection and the parity for error correction. ECC #1, ECC #2, and ECC #3 indicate encoding methods in which ECC #2 has an error correction capability higher than that of ECC #1, and ECC #3 has an error correction capability higher than that of ECC #2.

The second one is a method of fixing the data size of the parity included in a code word and dividing the user data. FIG. 3 is a diagram illustrating an example of improving the error correction capability by dividing the user data. In this way, by reducing the size of the user data to be subjected to the encoding for error correction while fixing the data size of the parity, it is possible to increase the error correction capability without increasing a circuit scale necessary for the encoding and decoding.

The above-described two methods are given as examples, and the example of improving the error correction capability is not limited to them. For example, there may be employed a method obtained by combining the above-mentioned two methods, so that the user data is divided and the data size of the parity is increased.

When the encoding is performed using a high error correction capability from the beginning, a possibility to fail the error correction becomes low, but a ratio of the parity to the user data becomes large. Therefore, in the embodiment, the encoding is performed according to an encoding method having a low error correction capability in an initial state where the nonvolatile memory 3 is less degraded. Then, in a case where the fatigue degree of the nonvolatile memory 3 is equal to or higher than a threshold, the encoding method is changed to that one having a high error correction capability. The fatigue degree of the nonvolatile memory 3 is not limited to be uniform in the nonvolatile memory 3. Therefore, it is possible to improve the error correction capability while suppressing an increase in total data size for the parity by changing the error encoding method, for example, in units of memory chips, blocks, pages, and the like of the nonvolatile memory 3 at the storage destination of the user data.

Figure 4:
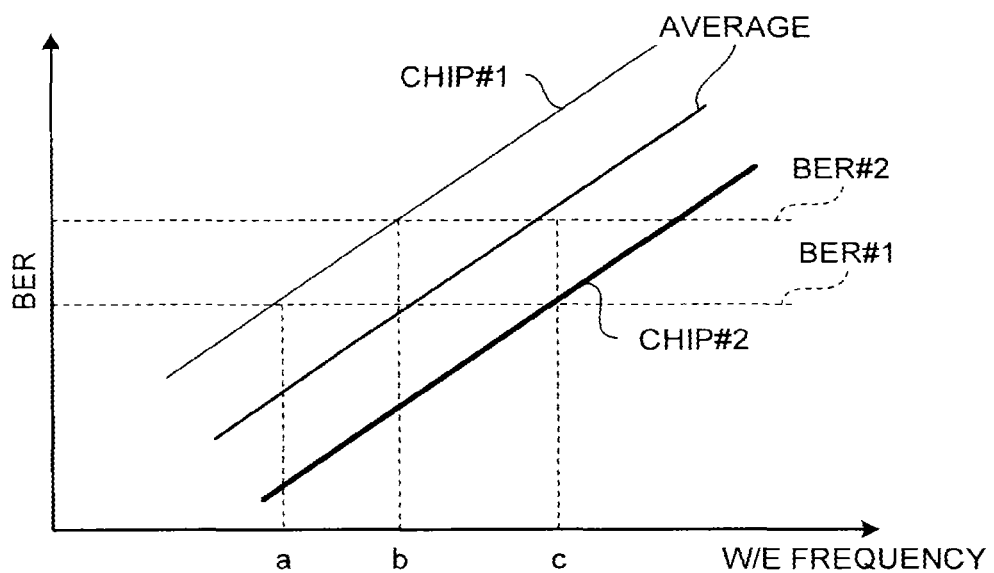
FIG. 4 is a diagram illustrating an example of switching a fatigue degree and the error correction capability of each memory chip.

FIG. 4 is a diagram illustrating an example of switching a fatigue degree and the error correction capability of each memory chip. FIG. 4 illustrates a switching timing between the fatigue degree and the error correction capability for each memory chip in a case where a BER (Bit Error Rate) is used as a measure of the fatigue degree. In FIG. 4, the vertical axis represents the BER, and the horizontal axis represents a W/E (Write/Erase) frequency. The straight line in the middle of three straight lines showing the BER in the drawing shows an average BER of the whole nonvolatile memory 3. The uppermost straight line shows the BER of Chip #1 which is a memory chip steeply degraded more than the average BER, and the lowermost straight line shows the BER of Chip #2 which is a memory chip degraded less than the average BER. In this way, the degradation characteristic may be different depending on the memory chips, blocks, and the like.

For example, after the configuration is made for corresponding to the three encoding methods ECC #1, ECC #2, and ECC #3 as illustrated in FIGS. 2 and 3, the BER of each memory chip is calculated. The BER, for example, is calculated for each memory chip by counting the number of errors calculated at the time of decoding in the decoding unit 26. In the initial state, the user data to be stored in Chip #1 and Chip #2 is encoded in ECC #1. Then, in a case where the BER exceeds BER #1, the encoding method is switched to ECC #2; in a case where the BER exceeds BER #2, the encoding method is switched to ECC #3. When the W/E frequency becomes "a", the encoding method of Chip #1 illustrated in FIG. 4 is switched to ECC #2; when the W/E frequency becomes "b" (a<b), the encoding method is switched to ECC #2. On the other hand, when the W/E frequency becomes "c" (c>b), the encoding method of Chip #2 is switched to ECC #1.

Figure 5:
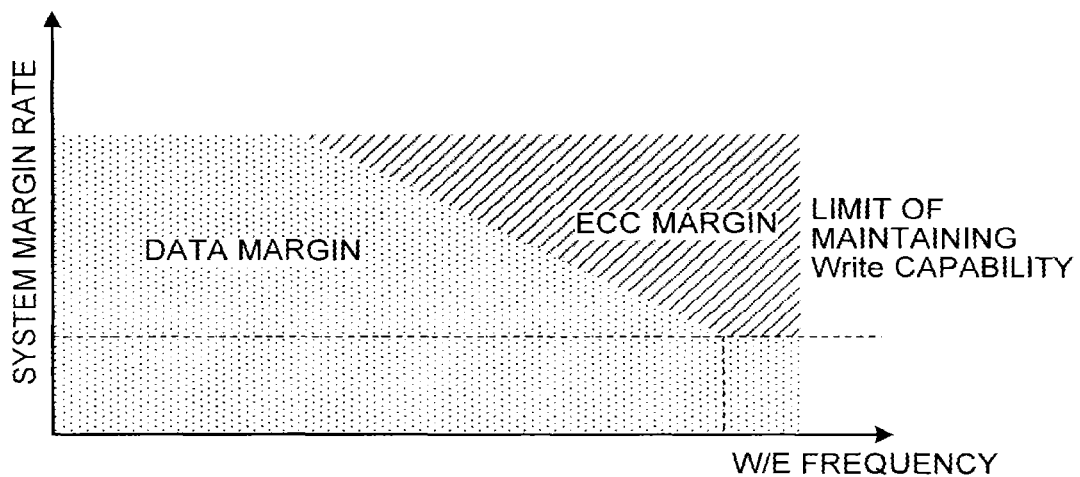
FIG. 5 is a diagram illustrating an example of a system margin rate.

FIG. 5 is a diagram illustrating an example of a system margin rate. The system margin rate indicates a ratio of an ECC margin to a data margin in the system margin. Herein, the data margin is a margin used for a process of increasing a write capability (random write performance), or a process of extending a lifespan. The ECC margin is a margin used for the parity. The system margin indicates a difference between the memory capacity actually installed in the nonvolatile memory 3 and an advertised data capacity of the semiconductor memory device 1, or a value obtained by subtracting a certain amount from the difference.

Figure 6:
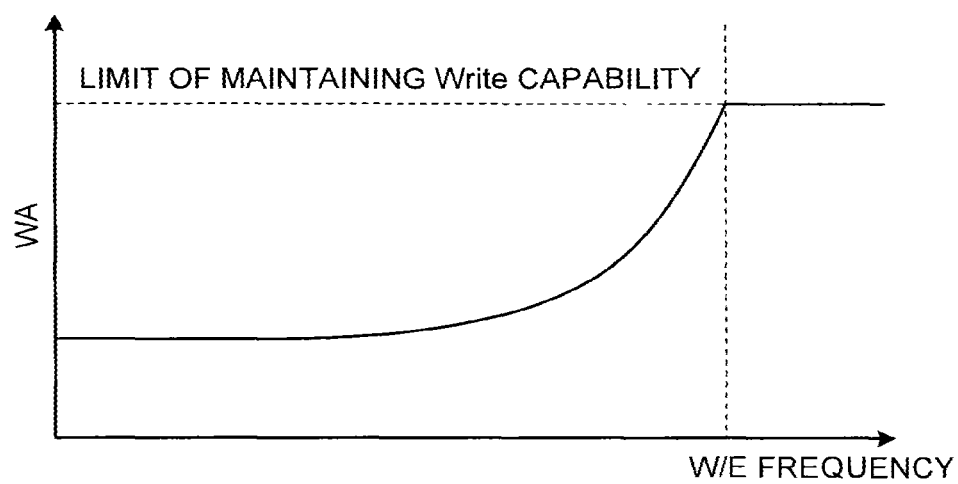
FIG. 6 is a diagram illustrating an example of WA.

FIG. 6 is a diagram illustrating an example of WA (Write Amplification). The WA is a ratio of the amount of data to be written in the nonvolatile memory 3 to the amount of writing data which is acquired from the host 4. FIG. 6 illustrates an aspect of a change in the WA in a case where the error correction capability is improved as the W/E frequency increases as illustrated in FIG. 5. The WA is low in the initial state, and increases as the ECC margin increases. When the WA exceeds the limit of maintaining the write capability, a rewriting frequency increases, the degradation of the memory cells progresses, and also the BER grows. For this reason, it is preferable that the error correction capability be increased in a range where the WA becomes equal to or less than the limit value. In the embodiment, the error correction capability is allowed to be improved in a range where the WA becomes equal to or less than the limit of maintaining the write capability. Further, the error correction capability is not allowed to be improved in a range where the WA exceeds the limit of maintaining the write capability. In this way, it is possible to improve the error correction capability while maintaining the write capability by setting the upper limit on the improvement of the error correction capability.

For example, the data margin corresponding to a case where the WA becomes the limit of maintaining the write capability is obtained as a limit for data capacity in advance, and a value obtained by subtracting the limit for the data capacity from the system margin is set as the upper limit of the ECC margin. Then, in a case where the total sum of parities in the whole nonvolatile memory 3 when the parities are calculated according to the encoding method set to each memory chip, block, or the like is equal to or lower than the upper limit of the ECC margin, the encoding method is allowed to be changed to make the error correction capability improved.

Figure 7:
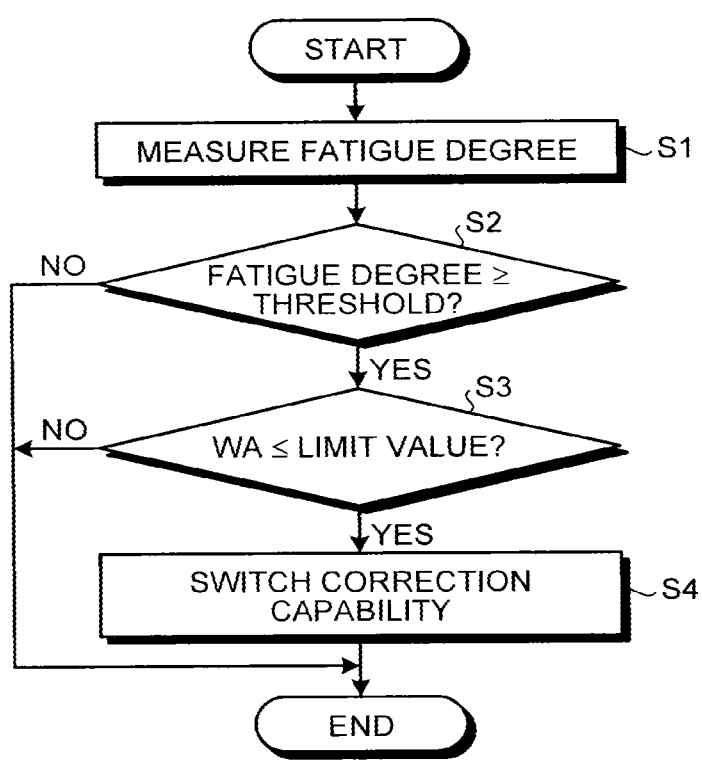
FIG. 7 is a flowchart illustrating an example of a switching procedure of the error correction capability according to the first embodiment.

FIG. 7 is a flowchart illustrating an example of a switching procedure of the error correction capability according to the embodiment. The ECC management unit 29 performs the following process on each certain area (a certain memory area, for example, each memory chip, each block, each page, each ECC frame (code word), and the like) of the nonvolatile memory 3. As for timing of performing the following process, for example, the process may be performed on a writing destination at a time when the writing destination is determined in receiving a writing request from the host 4. At the other timings, the following process may be performed.

First, the ECC management unit 29 acquires the fatigue degree of a certain area of the nonvolatile memory 3 (step S1). As the fatigue degree, for example, the above-described BER can be used. Besides the BER, another index such as an error bit number in the ECC frame can be used as the fatigue degree.

Next, the ECC management unit 29 determines whether the fatigue degree is equal to or higher than a threshold (step S2). In a case where the fatigue degree is equal to or higher than the threshold (Yes in step S2), it is determined whether the WA is equal to or lower than the limit value (step S3). Herein, the determination of whether the WA is equal to or lower than the limit value can be made not by actually obtaining the WA but by, for example as described above, determining whether the total sum of parities in the whole nonvolatile memory 3 is equal to or lower than the upper limit of ECC margin.

In a case where the WA is equal to or lower than the limit value (Yes in step S3), the correction capability (the error correction capability) is switched (step S4), and the process ends. Specifically, the encoding method for the user data stored in a certain area of the nonvolatile memory 3 is switched to an encoding method having a higher error correction capability. For example, three types of encoding methods ECC #1, ECC #2, and ECC #3 having different error correction capabilities are prepared, in which the error correction capability increases in the order of ECC #1, ECC #2, and ECC #3. In this case, when the memory chip at the writing destination of the user data is assumed to be encoded by ECC #1 until then, the encoding method of the memory chip is switched to ECC #2 in step S4.

In a case where the fatigue degree is lower than the threshold (No in step S2) and the WA is higher than the limit value (No in step S3), the process ends without changing the correction capability.

As described above, in the embodiment, in a case where the fatigue degree of each certain area of the nonvolatile memory 3 becomes equal to or higher than the threshold, the encoding method is switched to improve the error correction capability in a range where the WA becomes equal to or lower than the limit of maintaining the write capability. Therefore, it is possible to improve the error correction capability while maintaining the write capability.

Second Embodiment

Figure 8:
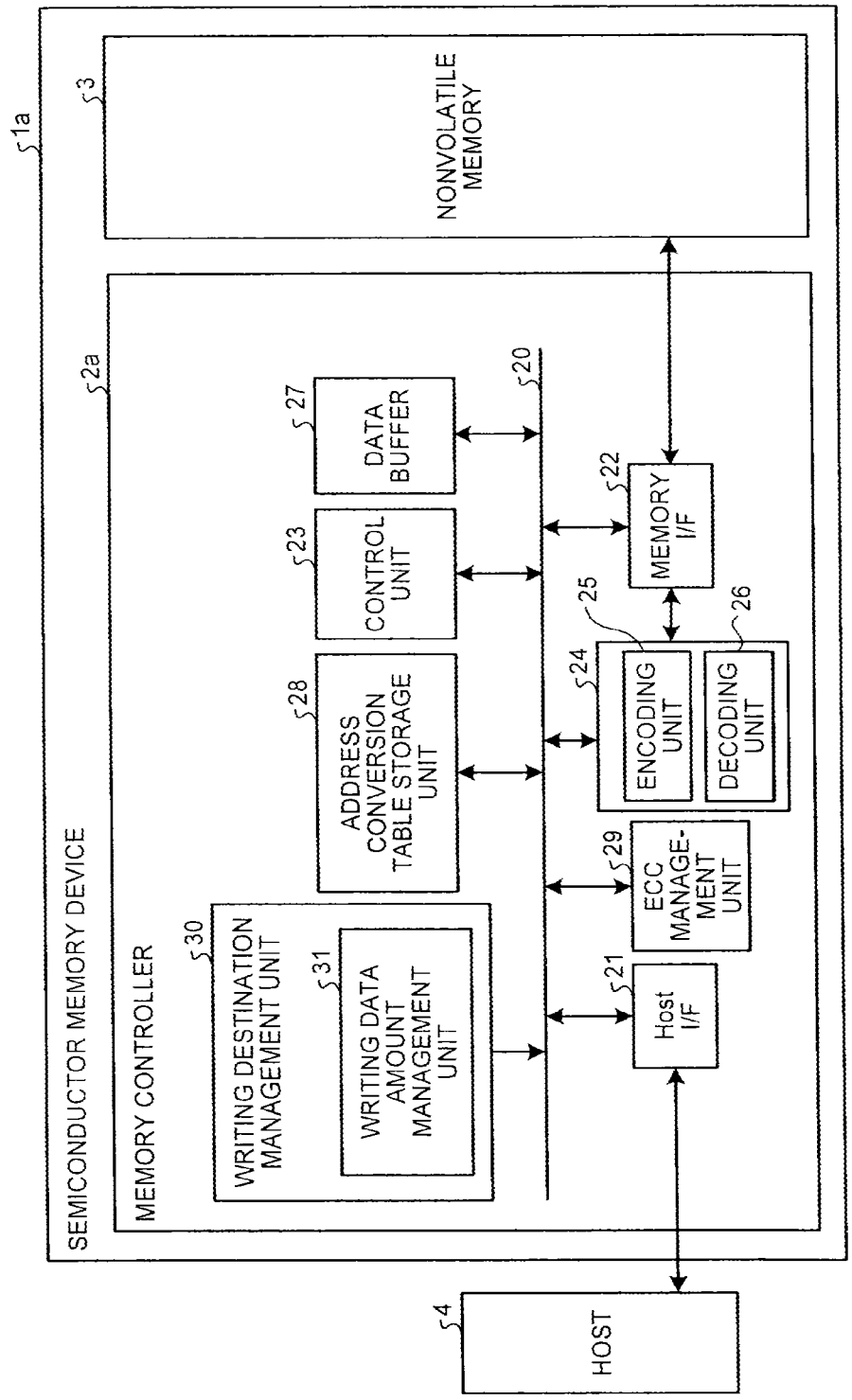
FIG. 8 is a block diagram illustrating an exemplary configuration of a memory device according to a second embodiment.

FIG. 8 is a block diagram illustrating an exemplary configuration of a memory device (a semiconductor memory device) according to a second embodiment. A semiconductor memory device 1a of the embodiment includes a memory controller 2a and the nonvolatile memory 3. The semiconductor memory device 1a of the embodiment is the same as the semiconductor memory device 1 of the first embodiment except that the memory controller 2 of the first embodiment is replaced with the memory controller 2a. In the memory controller 2a of the embodiment, a writing destination management unit 30 is added to the memory controller 2 of the first embodiment. The components having the same function as that of the first embodiment will be denoted by the same reference numeral as the first embodiment, and the description thereof will not be repeated.

In the first embodiment, the description has been made about an example that the error correction capability is changed according to the fatigue degree. In addition, in the first embodiment, the control unit 23 has been described to have a function as the writing destination management unit which determines a writing destination of the user data while a method of managing the writing destination has not been specified. In the embodiment, the writing destination management unit 30 is provided, and an example of writing management will be described in which the change of the error correction capability according to the fatigue degree described in the first embodiment is realized.

Further, herein, the embodiment will be described such that the writing destination management unit 30 is configured to be provided separately from the control unit 23, but the control unit 23 may be configured to have a function as the writing destination management unit 30.

Figure 9:
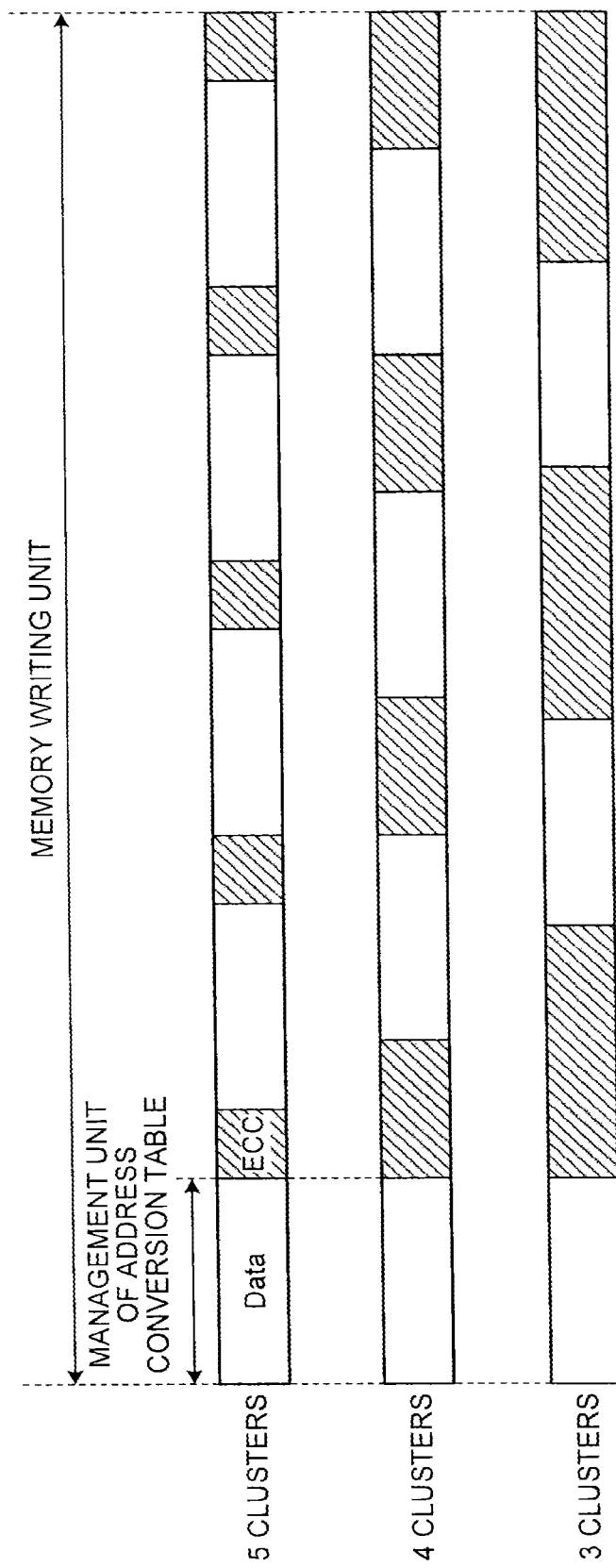
FIG. 9 is a diagram illustrating an example of a writing format which indicates writing management according to the second embodiment.

FIG. 9 is a diagram illustrating an example of a writing format which indicates the writing management according to the embodiment. FIG. 9 illustrates an example of changing the error correction capability by changing the data size of the parity as illustrated in FIG. 2 of the first embodiment. In the embodiment, a unit of memory areas of the nonvolatile memory 3 on which the writing can be simultaneously performed is referred to as a memory writing unit. The memory areas of the nonvolatile memory 3 on which the writing can be simultaneously performed may be one memory cell group (corresponding to one page) in the case of the single-level cell, or may be one memory cell group (corresponding to a plurality of pages) in the case of the multi-level cell. In addition, in a multi-plane type of nonvolatile memory 3 in which a plurality of blocks are allowed to be accessed in parallel, the memory area of the nonvolatile memory 3 on which the writing can be simultaneously performed may be a plurality of memory cell groups of the plurality of blocks which are allowed to be simultaneously accessed.

In the embodiment, the writing destination management unit 30 prepares a constant size of user data (hereinafter, refer to as a cluster), and determines a physical address corresponding to the logical address for each cluster. Then, the writing destination management unit 30 determines a writing destination such that the number of clusters in the memory writing unit becomes an integer. Referring to the example of FIG. 9, in the uppermost stage, the number of clusters in the memory writing unit is five; in the second stage, the number of clusters in the memory writing unit is four; and in the third stage, the number of clusters in the memory writing unit is three. Since the memory writing unit is fixed, the data size of the parity ("ECC" in the drawing) in the second stage is larger than that in the uppermost stage, and the data size of the parity in the third stage is larger than that in the second stage. Three types of formats illustrated in FIG. 9 correspond to the three types of error correction capabilities. In this case, all the three types of formats are configured to have the integer number of clusters in the memory writing unit.

Figure 10:
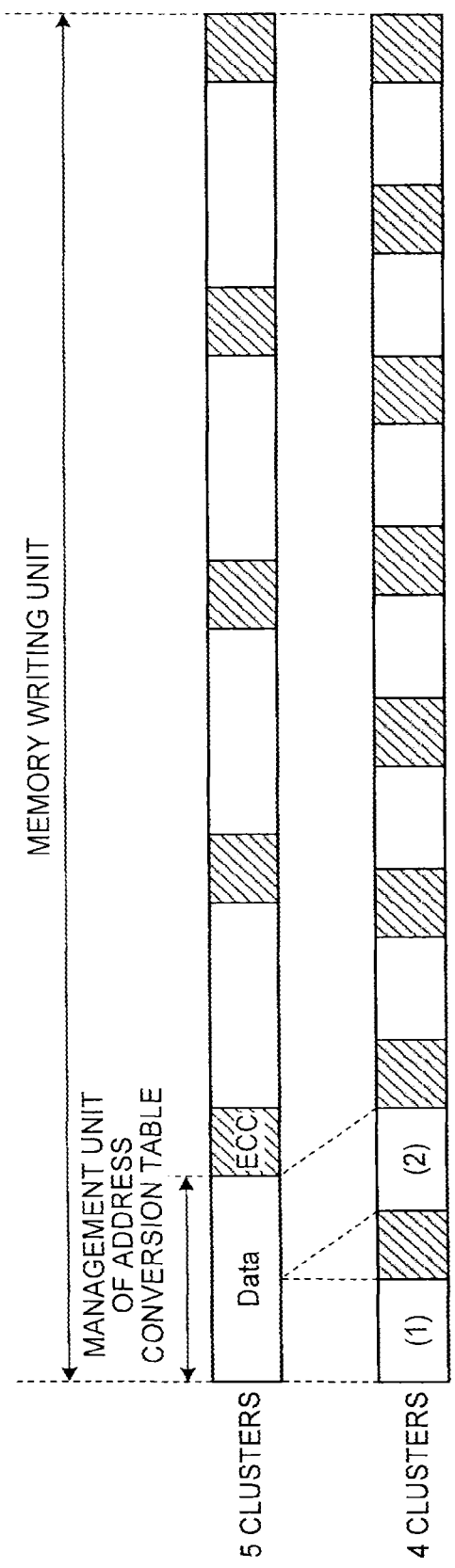
FIG. 10 is a diagram illustrating another example of a writing format which indicates the writing management according to the second embodiment.

FIG. 10 is a diagram illustrating another example of a writing format which indicates the writing management according to the embodiment. In the upper stage of FIG. 10, the number of clusters in the memory writing unit is five, and in the lower stage, the number of clusters in the memory writing unit is four. FIG. 10 illustrates an example of changing the error correction capability by dividing the user data as illustrated in FIG. 3 of the first embodiment. The writing destination management unit 30 determines the physical address corresponding to the logical address for each cluster similarly to the example of FIG. 9, and determines a writing destination such that the number of clusters in the memory writing unit becomes an integer. The cluster in the example of FIG. 10, however, becomes the user data forming one code word in a case where the error correction capability is lowest. In other words, a piece of user data ("Data") in the upper stage of FIG. 10 is a cluster. In the lower stage of FIG. 10, the cluster is divided into two pieces as denoted by (1) and (2). Each of the clusters divided into two pieces is referred to as a division cluster. In the case of the lower stage, the code word is generated in units of division clusters when the encoding is performed. However, even in the case of the lower stage, the physical address corresponding to the logical address is determined for each cluster. In other words, the physical address is determined in a unit of cluster obtained by combining the two division clusters of (1) and (2). Then, a writing destination is determined such that the number of clusters (data obtained by combining the two division clusters) in the memory writing unit becomes an integer.

Further, herein, a minimum unit for determining the encoding method (the error correction capability) will be set as the memory writing unit in order to manage the number of clusters in the memory writing unit. In other words, for example, in a case where a plurality of blocks are allowed to be simultaneously accessed, the encoding method is determined in a unit of the plurality of blocks. However, even in a case where the plurality of blocks are allowed to be simultaneously accessed, the encoding method may be determined differently for each block. In this case, the number of clusters on one page of each block among the plurality of blocks to which the simultaneous access can be allowed is configured to be an integer.

FIG. 11 is a diagram illustrating an example of an address conversion table according to the embodiment. The address conversion table may directly show the correspondence relation between the logical address and the physical address as described in the first embodiment, or may show the correspondence relation between the logical address and the physical address in multiple stages. FIG. 11 illustrates an example of the direct correspondence relation between the logical address and the physical address. The upper stage of FIG. 11 illustrates an example of the address conversion table in a case where three clusters are included in the memory writing unit as exemplarily illustrated in FIG. 9. The lower stage of FIG. 11 illustrates an example of the address conversion table in a case where four clusters are included in the memory writing unit. One row of each table corresponds to a unit of determining the logical address, that is, one cluster.

In the example of FIG. 11, the physical address is configured by two numerals representing a first physical address and a second physical address. The first physical address indicates a physical address on the nonvolatile memory 3 of the memory writing unit. The second physical address indicates a position (offset) in the memory writing unit. For example, in a case where the memory writing unit is set to one page, the first physical address indicates the physical address in the page unit, and the second physical address indicates a position in the page. As illustrated in FIG. 11, in a case where three clusters are included in the memory writing unit, three entries in the address conversion table have the same first physical address. In a case where four clusters are included in the memory writing unit, four entries in the address conversion table have the same first physical address.

When receiving the writing request from the host 4, the writing destination management unit 30 divides the writing target user data in units of clusters and determines the physical address at the writing destination for each cluster. In the embodiment, since the encoding method may be differently set for each certain area of the nonvolatile memory 3, the number of clusters which can be written in each certain area may become different. Generally, in the memory device using the NAND memory, empty blocks (writable blocks) called free blocks are managed, and one of the free blocks is selected as the writing destination. The writing destination management unit 30 includes a writing data amount management unit 31. In the embodiment, the number of clusters which can be written in each certain area is different. Therefore, the writing data amount management unit 31 manages the number of clusters which can be written in the memory writing unit for each free block, and stores the number as a free block table. Then, the writing destination management unit 30 determines the writing destination for each cluster with reference to the free block table.

FIG. 12 is a flowchart illustrating an example of a writing procedure according to the embodiment. The example of FIG. 11 has illustrated that the address conversion table directly indicates the correspondence relation between the logical address and the physical address, but in many cases the correspondence relation between the logical address and the physical address is indicated in the multiple stages to reduce the data size of the address conversion table. FIG. 12 illustrates a writing procedure on an assumption of the example in which the correspondence relation between the logical address and the physical address is indicated in the multiple stages. Herein, the description will be made about an example of two-stage conversions, one from the logical address to a logical block address and the other from the logical block address to the physical address. The address conversion table to be used for the former conversion is set as a read-out position management table, and the address conversion table to be used for the latter conversion is set as a logical-physical conversion table. The word "logical block" is generally defined in various meanings, but in this specification the memory areas on the nonvolatile memory 3 gathered in a unit (a memory writing unit) of allowing the simultaneous access is called the logical block, and the logical block address is assumed as an address indicating the logical block and a page in the logical block. For example, in a case where M (H is an integer of 1 or higher) blocks are allowed to be simultaneously accessed, the logical block address indicates an address of M pages obtained by adding up the respective pages of the M blocks.

Further, as described above, in a case where the encoding method in units of M blocks allowed to be simultaneously accessed is determined, that is, a case where a certain area is set as the M blocks allowed to be simultaneously accessed as described in the first embodiment, the logical block address may include only the address indicating the logical block. In other words, the logical block address may not include the address indicating a page in the logical block. With such a configuration, the size of the free block table can be made small.

As illustrated in FIG. 12, when receiving the writing request from the host 4 (step S11), the writing destination management unit 30 determines a logical block at the writing destination with reference to the free block table (step S12). FIG. 13 is a diagram illustrating an example of the free block table. As illustrated in FIG. 13, the free block table shows the number of clusters (data storage amount) which can be written in the logical block corresponding to each logical block address. In addition, in a case where the encoding method in units of M blocks allowed to be simultaneously accessed is determined, the logical block address may include the address of the logical block (the address indicating a page in the logical block may not be included) as described above. In this case, the data storage amount corresponding to each logical block is assumed as a total amount of data which can be stored in the logical block. The writing destination management unit 30 selects the logical block from the top of the free block table as the writing destination, and the logical block selected as the writing destination is deleted from the free block table.

Next, the writing destination management unit 30 acquires the physical address corresponding to the logical block at the writing destination which is determined in step S12 with reference to the logical-physical conversion table which is stored in the address conversion table storage unit 28 in advance (step S13). Herein, it is assumed that the address conversion table storage unit 28 manages the correspondence relation between the logical address and the physical address in two stages of the read-out position management table and the logical-physical conversion table. FIG. 14 is a diagram illustrating an example of a read-out position management table. FIG. 15 is a diagram illustrating an example of a logical-physical conversion table. The logical-physical conversion table illustrated in FIG. 15 shows the correspondence relation between the logical block address and the physical address (the physical address on the nonvolatile memory 3). FIG. 15 illustrates a case where the simultaneous access can be allowed to two physical blocks as an example, in which one logical block address corresponds to addresses of two physical blocks. Further, the information corresponding to the offset illustrated in FIG. 11 is not shown in FIG. 14.

Next, the writing destination management unit 30 encodes the user data received from the host 4 and writes the data at the physical address acquired in step S13 (step S14). Specifically, the writing destination management unit 30 informs the ECC management unit 29 and the memory I/F 22 of the acquired physical address, and the ECC management unit 29 determines an encoding method for a certain area corresponding to the informed physical address through the process illustrated in FIG. 7. Then, the ECC management unit 29 instructs the encoding unit 25 to perform the encoding in accordance with the obtained encoding method. The encoding unit 25 performs the encoding based on the instruction. The memory I/F 22 makes a control on the nonvolatile memory 3 such that the code word (the user data and the parity) encoded by the encoding unit is written at the physical address instructed from the writing destination management unit 30. The ECC management unit 29 stores the determined encoding method as encoding information for each certain area.

Alternatively, the process illustrated in FIG. 7 may not be performed at the time of receiving the writing request. For example, while the process illustrated in FIG. 7 is performed periodically or the like, the encoding method for each certain area determined in the process may be stored as the encoding information. The logical-physical conversion table may be used as the encoding information. A column of the data storage amount is added in the logical-physical conversion table illustrated in FIG. 15. Then, the data storage amount of the logical-physical conversion table is updated based on the encoding method determined in the process illustrated in FIG. 7. With such a configuration, the encoding method can be identified with reference to the logical-physical conversion table. Alternatively, information for identifying the encoding method may be added in the logical-physical conversion table instead of the data storage amount. The ECC management unit 29 obtains the encoding method based on the data storage amount of the logical-physical conversion table at the time of the encoding, and instructs the encoding unit 25 to perform the encoding using the obtained encoding method.

Next, the writing destination management unit 30 updates the read-out position management table of the address conversion table storage unit 28 (step S14). As exemplarily illustrated in FIG. 14, the read-out position management table creates entries in each size (for example, 4 Kbyte) of the cluster over the range in which the logical address is acquired, and the logical address at which no writing has been performed is stored with "invalid" as the logocal block address. The writing destination management unit 30 updates the read-out position management table based on the writing destination for the writing performed in step S14.

Figure 16:
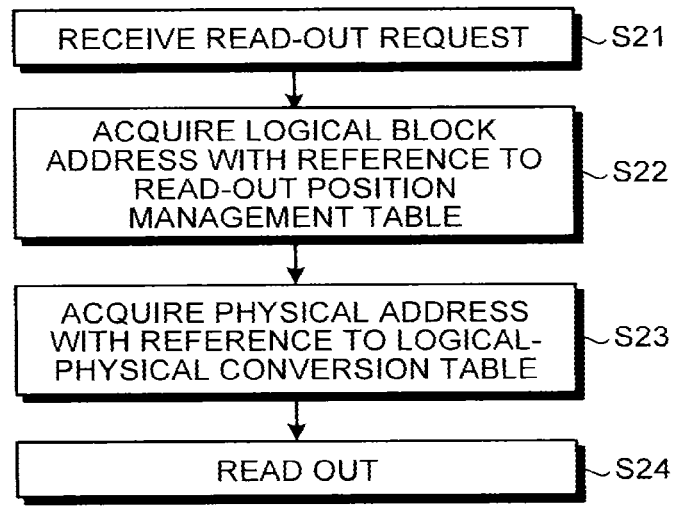
FIG. 16 is a flowchart illustrating an example of a read-out procedure according to the second embodiment.

Next, a read-out process of the embodiment will be described. FIG. 16 is a flowchart illustrating an example of a read-out procedure according to the embodiment. When receiving a read-out request from the host 4 (step S21), the control unit 23 obtains the logical block address corresponding to a read-out target logical address with reference to the read-out position management table of the address conversion table storage unit 28 (step S22). Next, the control unit 23 obtains the physical address corresponding to the logical block address with reference to the logical-physical conversion table of the address conversion table storage unit 28 (step S23). Then, the control unit 23 designates a physical address so as to instruct the memory I/F 22 to perform the reading from the nonvolatile memory 3, and the memory I/F 22 performs a control of reading data from the nonvolatile memory 3 (step S24).

The read-out user data and parity are decoded by the decoding unit 26. Specifically, the control unit 23 informs the ECC management unit 29 of the logical block address corresponding to the read-out target logical address, and the ECC management unit 29 obtains the corresponding encoding method based on the encoding information. Then, the ECC management unit 29 instructs the decoding unit 26 to perform the decoding in a decoding system corresponding to the encoding method.

As described above, in the embodiment, the writing destination of the nonvolatile memory 3 is determined for each cluster which is a certain size of the user data. Then, a plurality of encoding methods having different error correction capabilities are prepared, and the number of clusters in the memory writing unit is set to be an integer when the code word encoded according to each encoding method is written in the nonvolatile memory 3. Therefore, the logical address of the address conversion table is stored in units of clusters, and a case where the cluster size is set to be integer times the minimum unit of the logical address managed by the host 4, the table size can be made smaller than that in a case where the address conversion table is created in the minimum unit which is managed by the host. In addition, regardless of the encoding method, since one cluster is necessarily stored in an area which can be simultaneously read out, reading one cluster is performed by one reading operation. Therefore, it is possible to perform the reading fast regardless of the encoding method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory that includes a plurality of memory areas including a first memory area and a second memory area; and
a controller configured to:
in a case where a level of wear of the first memory area is lower than a first threshold,
determine a first size of first data and a first encoding method for encoding the first data to generate a first parity for correcting an error in the first data such that a sum of the first size and a site of the first parity is equal to a size of each of the plurality of memory areas,
encode the first data to generate the first parity in the first encoding method, and
write the first data and the first parity into the first memory area; and
in a case where a level of wear of the second memory area is higher than the first threshold,
determine a second size of second data and a second encoding method for encoding the second data to generate a second parity for correcting an error in the second data such that the second size is smaller than the first size, and a sum of the second size and a size of the second parity is equal to the size of each of the plurality of memory areas, encode the second data to generate the second parity in the second encoding method, and write the second data and the second parity into the second memory area, wherein an error correction capability for the second data using the second parity is higher than an error correction capability for the first data using the first parity.

2. The memory system according to claim 1, wherein the first data comprises a plurality of first data clusters and the first parity comprises a plurality of third parities, the plurality of third parities being for correcting an error in the plurality of first data clusters respectively, the second data comprises a plurality of second data clusters and the second parity comprises a plurality of fourth parities, the plurality of fourth parities being for correcting an error in the plurality of second data clusters respectively, and a size of each of the plurality of second data clusters is equal to a size of each of the plurality of first data clusters, a size of each of the plurality of fourth parities is larger than a size of each of the plurality of third parities.

3. The memory system according to claim 1, wherein the first data comprises a plurality of first data clusters and the first parity comprises a plurality of third parities, the plurality of third parities being for correcting an error in the plurality of first data clusters respectively, the second data comprises a plurality of second data clusters and the second parity comprises a plurality of fourth parities, the plurality of fourth parities being for correcting an error in the plurality of second data clusters respectively, and a size of each of the plurality of second data clusters is smaller than a size of each of the plurality of first data clusters, a size of each of the plurality of fourth parities is equal to a size of each of the plurality of third parities.

4. The memory system according to claim 1, wherein the level of wear of the first memory area comprises the number of write-and-erase cycles performed on the first memory area, and the level of wear of the second memory area comprises the number of write-and-erase cycles performed on the second memory area.

5. The memory system according to claim 1, wherein the level of wear of the first memory area comprises a bit error ratio of data read from the first memory area, and the level of wear of the second memory area comprises a bit error ratio of data read from the second memory area.

6. The memory system according to claim 1, wherein the controller is configured to determine to use the second encoding method in a case where a total size of parities to be stored is less than a second threshold.

7. The memory system according to claim 6, wherein the second threshold is determined so that a write performance of the memory system satisfies a predetermined performance.

8. The memory system according to claim 7, wherein the second threshold is further determined so that a write amplification of the memory system satisfies a third threshold.

9. The memory system according to claim 1, wherein each of the plurality of memory areas comprises a unit of a data write operation to the nonvolatile memory.

10. The memory system according to claim 1, wherein each of the plurality of memory areas comprises a memory chip.

11. A memory system comprising:

a nonvolatile memory that includes a plurality of memory areas including a first memory area and a second memory area; and a controller configured to:

in a case where a level of wear of the first memory area is lower than a first threshold, determine a first number of first data clusters and a first encoding method for encoding the first data clusters to generate a second number of first parities for correcting an error in the first data clusters such that a sum of a total size of the first number of first data clusters and a total size of the second number of first parities is equal to a size of each of the plurality of memory areas, encode the first number of first data clusters to generate the second number of first parities in the first encoding method, and write the first number of first data clusters and the second number of first parities into the first memory area; and in a case where a level of wear of the second memory area is higher than the first threshold, determine a third number of second data clusters and a second encoding method for encoding the second data clusters to generate a fourth number of second parities for correcting an error in the second data clusters such that a total size of the third number of second data clusters is smaller than a total size of the first number of first data clusters, and a sum of the total size of the third number of second data clusters and a total size of the fourth number of second parities is equal to the size of each of the plurality of memory areas, encode the third number of second data clusters to generate the fourth number of second parities in the second encoding method, and write the third number of second data clusters and the fourth number of second parities into the second memory area, wherein an error correction capability for the second data clusters using the second parities is higher than an error correction capability for the first data clusters using the first parities.

12. The memory system according to claim 11; wherein a size of each of the third number of second data clusters is equal to a size of each of the first number of first data clusters, a size of each of the fourth number of second parities is larger than a size of each of the second number of first parities.

13. The memory system according to claim 11, wherein a size of each of the third number of second data clusters is smaller than a size of each of the first number of first data clusters, a size of each of the fourth number of second parities is equal to a size of each of the second number of first parities.

14. The memory system according to claim 11, wherein the level of wear of the first memory area comprises the number of write-and-erase cycles performed on the first memory area, and the level of wear of the second memory area comprises the number of write-and-erase cycles performed on the second memory area.

15. The memory system according to claim 11, wherein the level of wear of the first memory area comprises a hit error ratio of data read from the first memory area, and the level of wear of the second memory area comprises a bit error ratio of data read from the second memory area.

16. The memory system according to claim 11, wherein the controller is configured to determine tai use the second encoding method in a case where a total size of parities to be stored in the second memory area is less than a second threshold.

17. The memory system according to claim 16, wherein the second threshold is determined so that a write performance of the memory system satisfies a predetermined performance.

18. The memory system according to claim 17, wherein the second threshold is further determined so that a write amplification of the memory system satisfies a third threshold.

19. The memory system according to claim 11, wherein each of the plurality of memory areas comprises a unit of a data write operation to the nonvolatile memory.

20. The memory system according to claim 11, wherein each of the plurality of memory areas comprises a memory chip.

* * * * *